(12) United States Patent
Bedell

(10) Patent No.: US 8,499,437 B2
(45) Date of Patent: Aug. 6, 2013

(54) DEVICE AND A METHOD FOR ALIGNING A PANEL HAVING CIRCUIT ELEMENTS WITH A DRIVER

(75) Inventor: Ware Bedell, Cumming, GA (US)

(73) Assignee: American Panel Corporation, Alpharetta, GA (US)

( * ) Notice: Subject to any disclaimer, the term of this patent is extended or adjusted under 35 U.S.C. 154(b) by 1522 days.

(21) Appl. No.: 12/056,849

(22) Filed: Mar. 27, 2008

(65) Prior Publication Data

US 2009/0243988 A1     Oct. 1, 2009

(51) Int. Cl.
*B23P 19/00* (2006.01)
*H01R 43/00* (2006.01)
*H05K 13/04* (2006.01)

(52) U.S. Cl.
USPC ............. 29/729; 29/426.1; 29/428; 29/711; 29/739; 29/760; 345/98

(58) Field of Classification Search
USPC ............. 29/426.1, 428, 469, 711, 721, 729, 29/739, 742, 760; 345/98
See application file for complete search history.

(56) References Cited

U.S. PATENT DOCUMENTS

| | | | | |
|---|---|---|---|---|
| 3,837,063 A | * | 9/1974 | Wright | 227/2 |
| 4,636,067 A | * | 1/1987 | Richards, Sr. | 355/91 |
| 4,797,714 A | * | 1/1989 | Bujese | 355/77 |
| 4,824,632 A | * | 4/1989 | Meuschke et al. | 376/261 |
| 4,913,559 A | * | 4/1990 | Meuschke et al. | 376/260 |
| 5,566,840 A | * | 10/1996 | Waldner et al. | 211/41.17 |
| 5,896,649 A | * | 4/1999 | Millhimes et al. | 29/739 |
| 5,924,192 A | * | 7/1999 | Wuyts | 29/833 |
| 6,711,810 B2 | * | 3/2004 | Buley et al. | 29/830 |
| 2006/0223365 A1 | * | 10/2006 | Campbell | 439/540.1 |

\* cited by examiner

*Primary Examiner* — Paul D Kim
(74) *Attorney, Agent, or Firm* — Standley Law Group LLP

(57) ABSTRACT

A device for aligning a LCD panel having circuit elements with driver circuit card assemblies, consisting of retractable pins located around a central platform. The retractable pins extend in order to receive the LCD panel and circuit element assembly and hold it in place as the circuit elements are aligned with driver circuit card assemblies. Once aligned, the drivers and LCD panel can be bonded together. Once bonded, the pins are retracted and the LCD panel and driver assembly is released. The present invention also relates to a method of aligning LCD panels and drivers using retractable pin tools.

19 Claims, 13 Drawing Sheets

DEVICE AND A METHOD FOR ALIGNING A PANEL HAVING CIRCUIT ELEMENTS WITH A DRIVER

CROSS-REFERENCE TO RELATED APPLICATIONS

This application makes no priority claim.

TECHNICAL FIELD

Exemplary embodiments relate generally to a device and method that may be used in the manufacture of flat panel display devices. More particularly, the exemplary embodiments relate to a device and method that may be used to align a display with one or more drivers.

BACKGROUND AND SUMMARY OF THE INVENTION

Flat panel displays using liquid crystal display (LCD) technology are widely known and have found application in a number of fields for displaying visual information. In a flat panel LCD, the screen area, which is substantially rectangular, is divided into a large number of individual color dots. Each set of color dots is capable of displaying a full color gamut. It is known for the sets to comprise a three-dot combination of red, green and blue, a four-dot combination of red, green, green and blue, a four-dot combination of red, green, blue and white, and a six-dot combination of red, green, blue, yellow, cyan and magenta, as well as other combinations that allow a full color display. In an active matrix flat panel LCD, each color dot contains a transistor switch. A liquid crystal fluid, contained between a front plate and a rear plate, is twisted by a voltage which changes the axis of polarization of light, allowing the individual color dots to transmit or block light passing from a backlight source through the individual color filters. The color dots are arranged in a grid comprising rows and columns, and there can be several hundred or thousand vertical columns of color dots going across the display as well as hundreds or thousands of horizontal rows of color dots, resulting in most cases in more than 1,000,000 individual color dots. Each color dot has a vertical column and horizontal row grid address and is driven by electrical impulses fed along its respective row from a bus located on one of the side edges of the flat panel LCD and along its respective column from a top or bottom edge of the flat panel LCD. In general, the horizontal row drivers are referred to as gate drivers and the vertical column drivers are referred to as source drivers, but these may be reversed in practice, as will be known to those of skill in the art. In either case, the source driver signal provides the gray scale data for a given color dot, while the gate driver signal changes a given line of thin film transistors ("TFTs") from "off" to "on" for a given "line time." This signal from the gate driver thereby allows the charging of a capacitor associated with the individual color dot, determining the voltage held by the color dot for an entire frame period.

During the manufacture of a flat panel LCD, the panel that comprises the liquid crystal fluid and the front and rear plates contains flexible printed circuit elements that function as input and output for the gate, source, and heater driver circuit card assemblies. These circuit elements, or "tabs", contain electrical contacts, or "pads", that must be properly aligned with matching electrical contacts on each respective driver circuit card assembly in order for all the color dots to receive electrical signals and respond properly. An anisotropic, electrically conductive adhesive is typically used to make the electrical connection between the pads on the tabs of the LCD and the pads on each driver circuit card assembly, or "driver." Alignment is key, as misalignment can result in a LCD display where parts of the screen are either partially or completely unresponsive to electrical signals, and is unsuitable for sale.

Furthermore, because LCD tabs are very fragile the process of aligning a tab with a driver can damage an LCD if the tabs are allowed to flex, shift, or rub against the drivers or other surfaces during the alignment process.

One previous attempt at aligning the LCD tabs to the drivers was done by placing tooling holes on both the LCD tabs and drivers such that when the LCD tabs were properly aligned over the drivers the tooling holes on the tabs and the drivers would line up. Electrical pads were located on both the tabs and drivers such that when aligned, the tooling holes would align as well, and pins could be driven through the holes to hold the LCD tabs and the drivers in proper alignment. However, this process has its disadvantages. The alignment of the tabs is difficult due to the delicateness and flexibility of the LCD tabs. Once in place the pins would stick and be difficult to remove without a substantial amount of prying, which had the potential to damage the tabs and drivers. Again, due to the fragility of the tabs, tabs could only sustain so much bending or damage before they would be considered useless under industry standards. For this reason this process often resulted in high product fallout. Furthermore, transportation of the LCD with tabs adhered to the drivers would also cause substantial damage to the tabs and reduce productive output due to unintended bending of the tabs due to handling.

The known art has failed to provide a device and method for properly aligning a LCD tab with drivers without damaging the LCD tabs or drivers. Furthermore, the known art has yet to provide a carrier for transporting a LCD with adhered tabs that have been aligned upon a driver.

An exemplary embodiment includes a retractable pin tool device for aligning a LCD panel with adhered tabs with driver circuit card assemblies. It is also an object of the exemplary embodiments to provide a retractable pin tool device for aligning a LCD panel with adhered tabs to with gate, source, and heater driver circuit card assemblies. An exemplary embodiment provides a method for aligning an LCD panel with adhered tabs to gate, source and heater driver circuit card assemblies using retractable pins.

Exemplary embodiments may comprise a base upon which a center platform and one or more pin blocks are attached. The center platform may be adapted to receive a first item. The pin blocks each have a plurality of pins that extend from their surface, and the pin blocks each have a means for retracting said pins into their surface. Handles may also be used in association with the pinion blocks to control the retraction and extension of pins. The pin blocks are located around the perimeter of the center platform such that when a first item is placed on the center platform, the pins may hold a second item in fixed position relative to the first item. In some embodiments the pins may hold the first item in place as well as a second item in place. Once it is no longer desired for the pins to hold one or more items in place, the pins may be retracted into the pin blocks. When the pins are retracted any item formerly held in place by the pins is released. In some embodiments the center platform may be adapted to receive an LCD panel that has adhered tabs.

The retractable pins may be used to hold gate, source, and heat drivers in fixed relative positions to the LCD panel and adhered tabs so that they can be bonded together or otherwise manipulated. The pins can hold these items in position while preventing shifting of the items and its damaging effects. Also, the pins can be retracted into the pin blocks without difficulty and without injuring the LCD panel assembly. Depending on the embodiment, different amounts of pin blocks may be present, the position of the pin blocks relative to the central platform may vary, and the location and number of pins on each pin block may vary.

BRIEF DESCRIPTION OF THE DRAWINGS

A better understanding of the disclosed embodiments will be obtained from a reading of the following detailed description and the accompanying drawings wherein identical reference characters refer to identical parts and in which.

DETAILED DESCRIPTION

Figure 1:
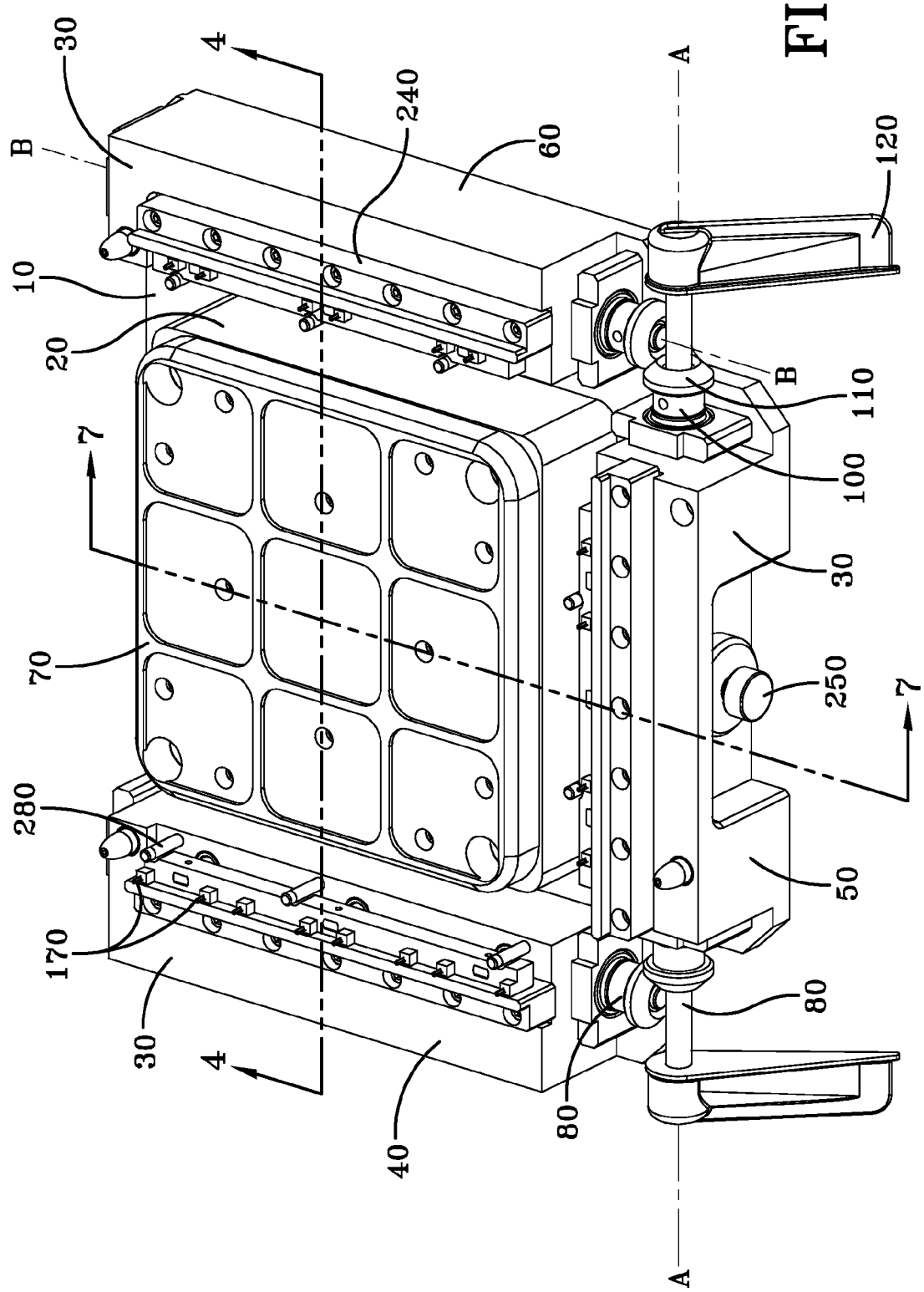
FIG. 1 shows a top perspective view of an exemplary embodiment of a device of the exemplary embodiments.
Figure 2:
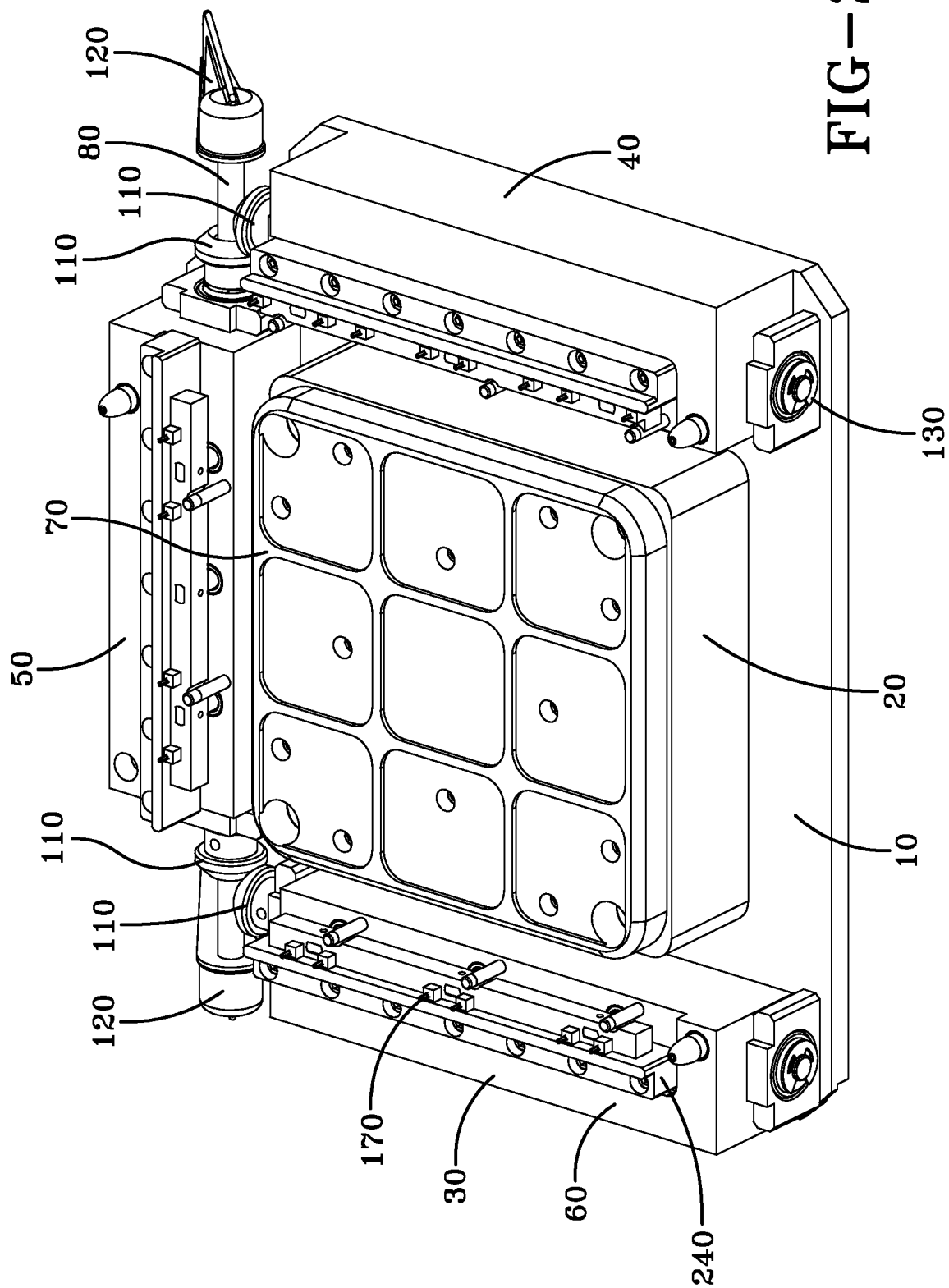
FIG. 2 shows a rear perspective view of the exemplary device of FIG. 1.

FIGS. 1 and 2 illustrate an exemplary embodiment may be used for aligning one or more source, gate, or heater driver circuit card assemblies (or "drivers") to the circuit elements (or "tabs") adhered to a liquid crystal display (LCD) panel. The device may consist of a base platform 10 with a substantially square center platform 20 and three rectangular pin blocks 30 positioned along three sides of the center platform 20. Each pin block 30 may align a different type of driver with an LCD display that is positioned on the center platform 20. As shown in FIGS. 1 and 2, there may be a source pin block 40, a gate pin block 50, and a heater pin block 60. The gate pin block 50 may be located on the front of base platform 10 while the source pin block 40 and heater pin block 60 maybe located along the left and right sides of the center platform 20, respectively. The center platform 20 is fixedly attached to the base platform 10. A substantially square center cap 70 may cover the top of the center platform 20. The center cap 70 may be shaped such that it can receive an LCD panel and provide proper support and/or prevent shifting of an LCD display without the use of additional tooling to support the LCD and adhered tabs. The center cap 70 shown in FIGS. 1 and 2 may be used for those LCD panels that do not have rear laminations. In some embodiments the center caps 70 may be shaped differently to accommodate LCD panels having rear laminations. In some embodiments the center cap 70 may be removable so that different center caps 70 can be attached to the center platform 20 as desired.

The base platform 10, center platform 20, and pin blocks 30 may be made out of any rigid material such as phenolic molding, steel, wood, or hard plastic. Depending on the materials used the base platform 10 and center platform 20 may be formed from one piece of material. In other embodiments the different parts of the base platform 10 and center platform 20 may be created separately and assembled using screws or adhesives. Furthermore, while in some embodiments the center platform 20 may have a substantially square shape, in other embodiments the center platform 20 and center cap 70 may have different shapes to accommodate the shape of the LCD panel being used. Furthermore, in other embodiments the shape of the pin blocks 30 may also be different from those shown in FIGS. 1 and 2. As shown in FIGS. 1 and 2 the top surface of the pin blocks may not be flat, but may be carved out as desired to provide proper stability and strength to the device.

As shown in the exemplary embodiment of FIG. 1, each pin block 30 may have a corresponding pinion set 80. Each pinion set 80 may be made of a pinion wire 90 that is located inside the length of its respective pin block 30. In the gate pinion set 100 the pinion wire 90 extends out of the gate pin block 50 on both ends, where it is encircled by a miter gear 110 on each end, and capped by a handle 120 on each end.

The pinion wire 90 in the heater pin block 60 and source pin block 40 extend out the front ends of both pin blocks, where they are capped by miter gears 110. On the back surface of the heater pin block 60 and source pin block 40 the pinion wires are capped with retaining clips 130. In all the pinion sets 80 the pinion wires 90 may have gear teeth at least along the length of their respective pin block 30.

The location of the miter gears 110 on the pinion wires 90 of the gate, heater, and source pinion sets 80 are such that the teeth on the miter gears 110 on left and right side of the gate pinion set 100 engage with the teeth on the miter gear 110 of the source and heater pinion sets 80 respectively.

Figure 3:
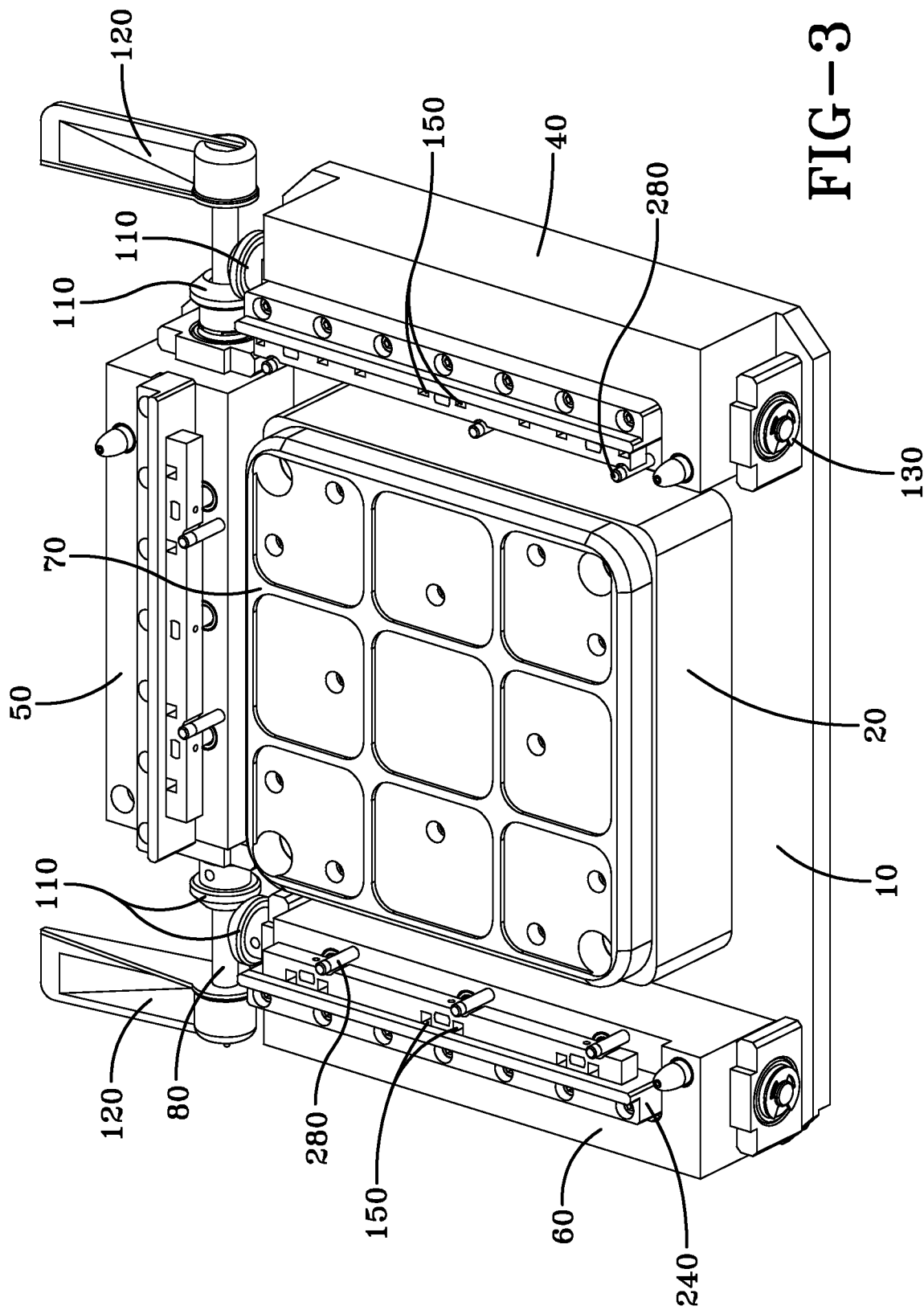
FIG. 3 shows a rear perspective view of the exemplary device of FIG. 1.
Figure 4:
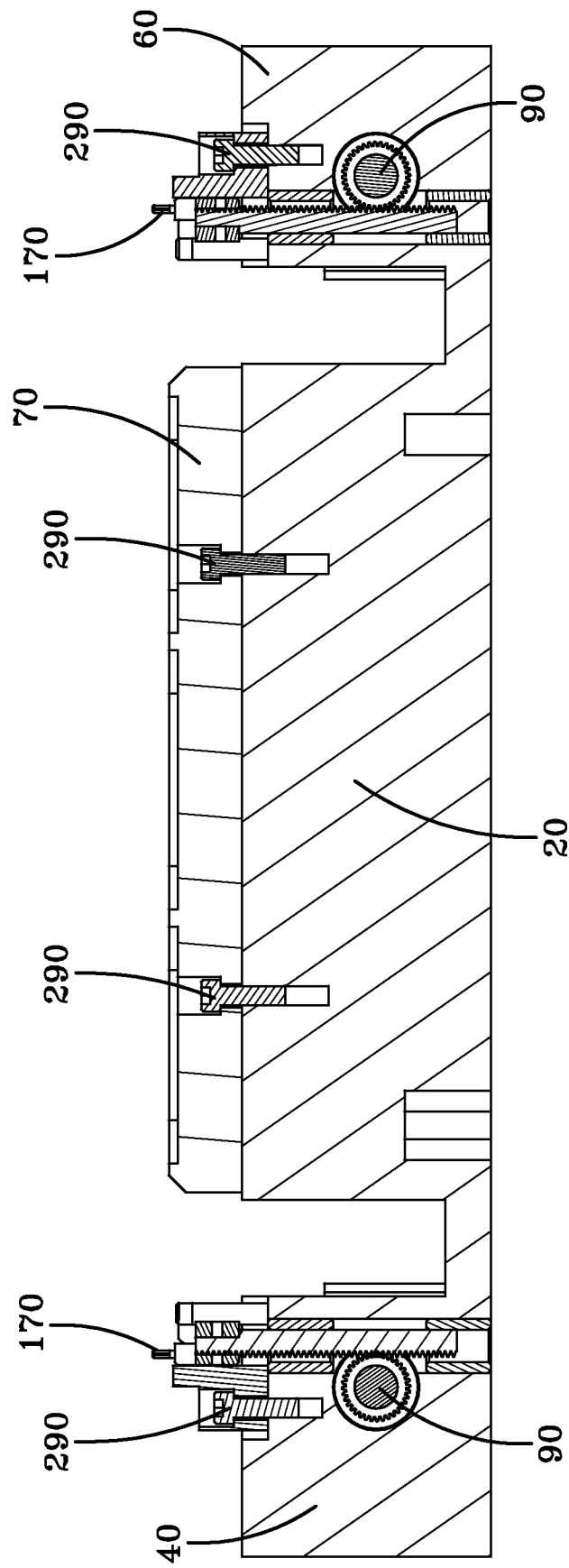
FIG. 4 shows a front elevational view of a cross-section of the exemplary device of FIG. 1 as taken along line 4-4.
Figure 5:
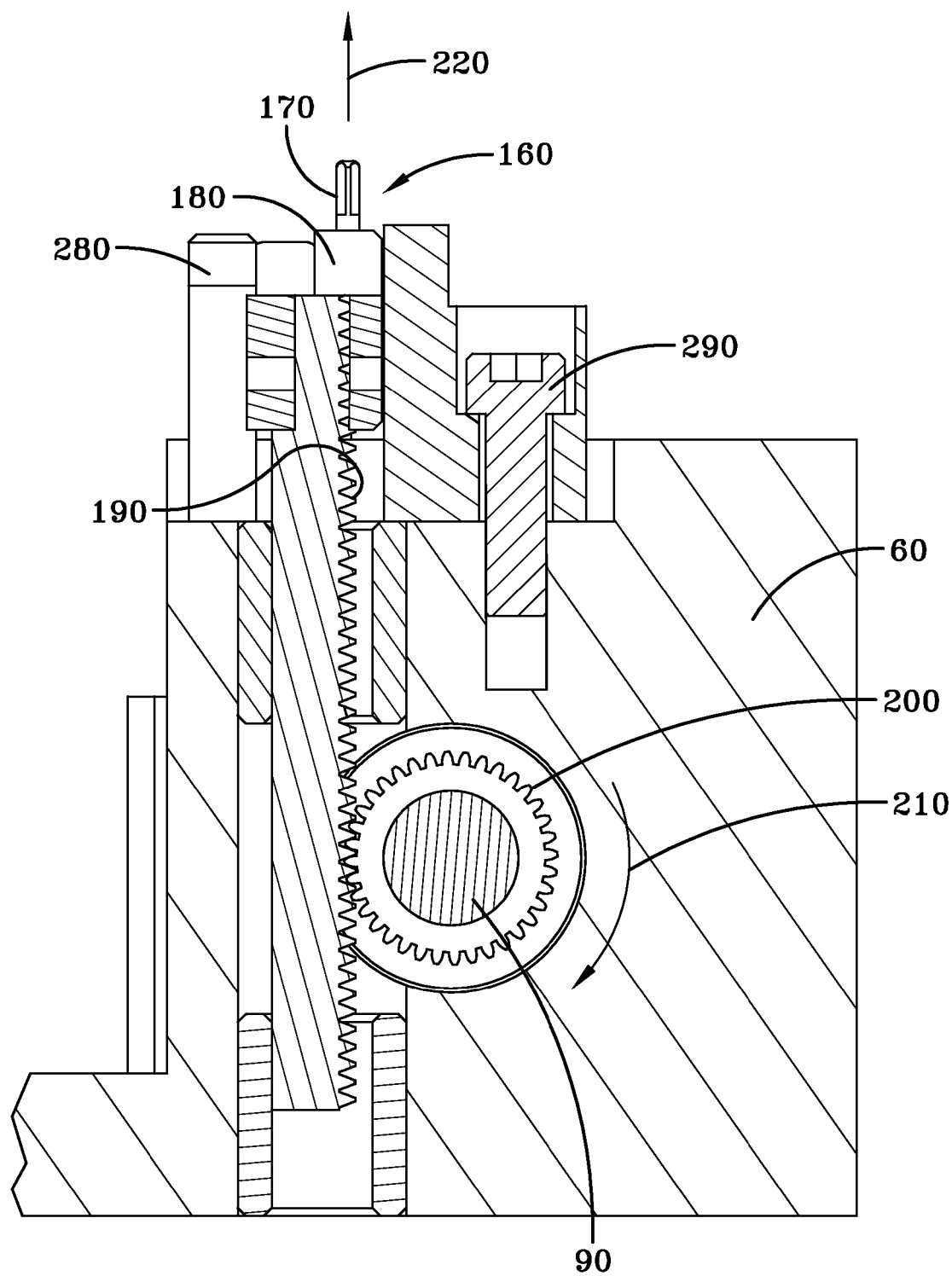
FIG. 5 shows cross-sectional, fragmented view of an exemplary embodiment of a heat pin block as shown in FIG. 4.

Located along the length of each pin block may be a series of pin holes 150. As shown in FIG. 3 where the handles 120 are located in an "up" position, in some embodiments the pin holes 150 may be square. The pin holes 150 may be deep enough that they extend beyond the depth of the pinion wires 90. In some embodiments the pin holes 150 may extend through the pin blocks 30 and to the bottom surface of the base platform 10. However, in other embodiments the pin holes 150 may not reach through the bottom surface of the base platform 10. As shown in FIGS. 4 and 5, within each pin hole 150 may be a pin assembly 160 consisting of a square pin 170 mounted to a square pin base 180. The width of the pin base 180 may be slightly smaller than that of the pin hole 150 so that the pin assembly 160 may move vertically within the pin hole 150 but are restricted from shifting in a horizontal direction. The side of the pin bases 180 facing the pinion wires 90 may contain pin base teeth 190 that are sized to engage with the pinion wire teeth 200. The relative location of the pin holes 150 and pin bases 180 to the pinion wires 90 may be such that the pin base teeth 190 are always engaged with the pinion wire teeth 200.

In the embodiment shown in FIG. 3, four pin holes 150 are located on the top surface of the gate pin block 50, while the source pin block 40 and heater pin block 60 have eight and six pin holes 150, respectively. As shown in FIG. 3, the pin holes 150 may be located in series. The pin holes 150 on the gate pin block 50 are located in two series of two pin holes 150 each, with the pin holes 150 in both series equally spaced from one another. The heater pin block 60 has three series of two pin holes 150 each, while the source pin block 40 has three alternating series of pin holes 150 having three, two, and three pin holes 150 respectively. In other embodiments the pin holes 150 may be located in different series, may be evenly distributed across the length of the pin blocks 30, or may be located in any other desirable positions. Furthermore, in other embodiments different numbers of pin holes 150 may be located on the pin blocks.

The movement of the pin assemblies 160 through the pin holes 150 is caused by turning the handles 120 from an "up" to a "down" position, and vice versa. That is, when the handles 120 are located in an "up" position, as shown in FIG. 3, the pin assemblies 160 are completely within the pin holes 150 and the tops of the pins 170 do not breach the surface of the pin blocks 30. However, as the handles 120 are pushed downwards, they cause the pinion wire 90 in the gate pinion set 100 to rotate around the axis of the pinion wire 90. The miter gears 110 on each end of the gate pinion set 100 engage with the miter gears 110 on the source and heater pinion sets 80, which in turn causes the pin wires 90 in the source and heater pinion sets 80 to also rotate about their respective axes. The direction of rotation of the pinion wire 90 in the heat pinion set 100 around the axis B-B of the pinion wire in the heater pin block 40 during movement of the handles from an "up" to "down" position is shown by arrow 210 in FIG. 5.

As each pinion wire 90 rotates, the pinion wire teeth 200 engage with the pin base teeth 190 on each pin assembly 160. The rotation of the pinion wire 90 causes the pin assemblies 160 to move in unison upwards towards the top surface of their respective pin block 30. This movement continues until the handles have reached the "down" position, shown in FIGS. 1 and 2. The movement of the pin assemblies 160 during the movement of the handles 120 from the "up" to "down" position is shown by arrow 220.

Figure 6:
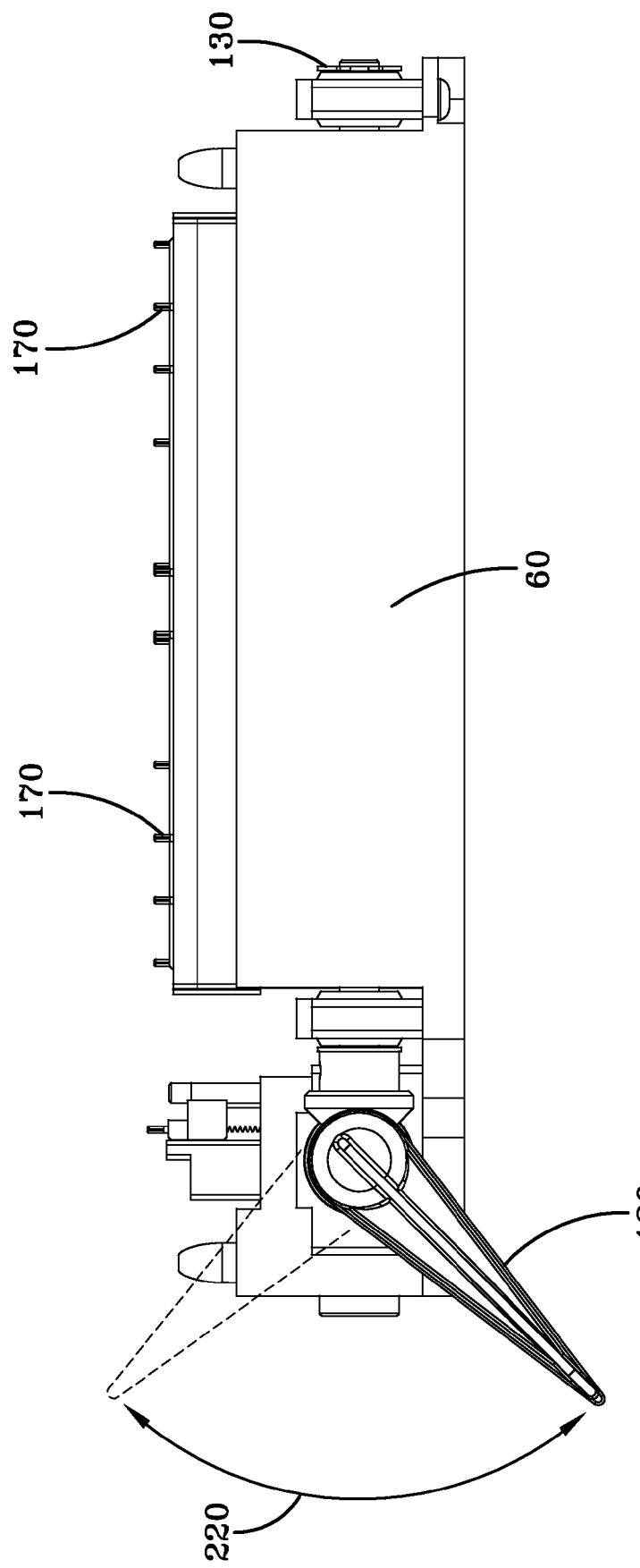
FIG. 6 shows a right side elevational view of the exemplary device of FIG. 1.

FIG. 6 shows the arc 230 the handles 120 may make as they move from the "down" position to the "up" position. In some embodiments the angle of this arc 230 may be ninety degrees. However, in other embodiments this angle may be smaller or larger. As shown in FIGS. 1 and 2, when the handles 120 are in the "down position" the pins 170 and part of the pin bases 180 may extend through the top surface of the pin blocks 30. The height of the pins 170 and pin bases 180, as measured from the top of the pin blocks 30 when the handles are in the "down" position may be the same for all the pins assemblies 160 in the device. In some embodiments the handles 120 may be in different positions as the pins 170 are retracted. For example, in some embodiments the handles 120 may be in a "down" position when the pins 170 are retracted, and may be moved to an "up" position as the pins 170 are extended. In these embodiments the means for retracting the pins 70, whether through the use of pinion wires 90 or not, may be adjusted accordingly to address a different direction of movement of the handles 120. In still other embodiments there may be no handles 120, but instead there may be a switch, button, or other means for engaging the retracting means. In other embodiments the pin tool may be automated.

As shown in FIGS. 1 and 2, in some embodiments there may be braces 240 located on the top surface of the pin blocks. The braces 240 may aid in the alignment of drivers with the LCD panels.

In order for the pins 170 to be retracted, the handles 120 may be moved into the "up" position. Because the handles are attached to the gate pinion set 100, rotation of the handles about axis A-A of the pinion wire 90 in the gate pinion set 100 causes the pinion wire 90 in the gate pinion set 100 to rotate, which in turn rotates the pinion wires 90 in the source and heater pinion sets 80 in a counter-clockwise fashion. Through the engagement of the pin base teeth 190 with the pinion wire teeth 200, the pin assemblies 160 may be pulled downwards into the pin blocks 30. As the handles reach the "up" position the pin assemblies 160 may be fully retracted into the pin blocks 30.

Figure 7:
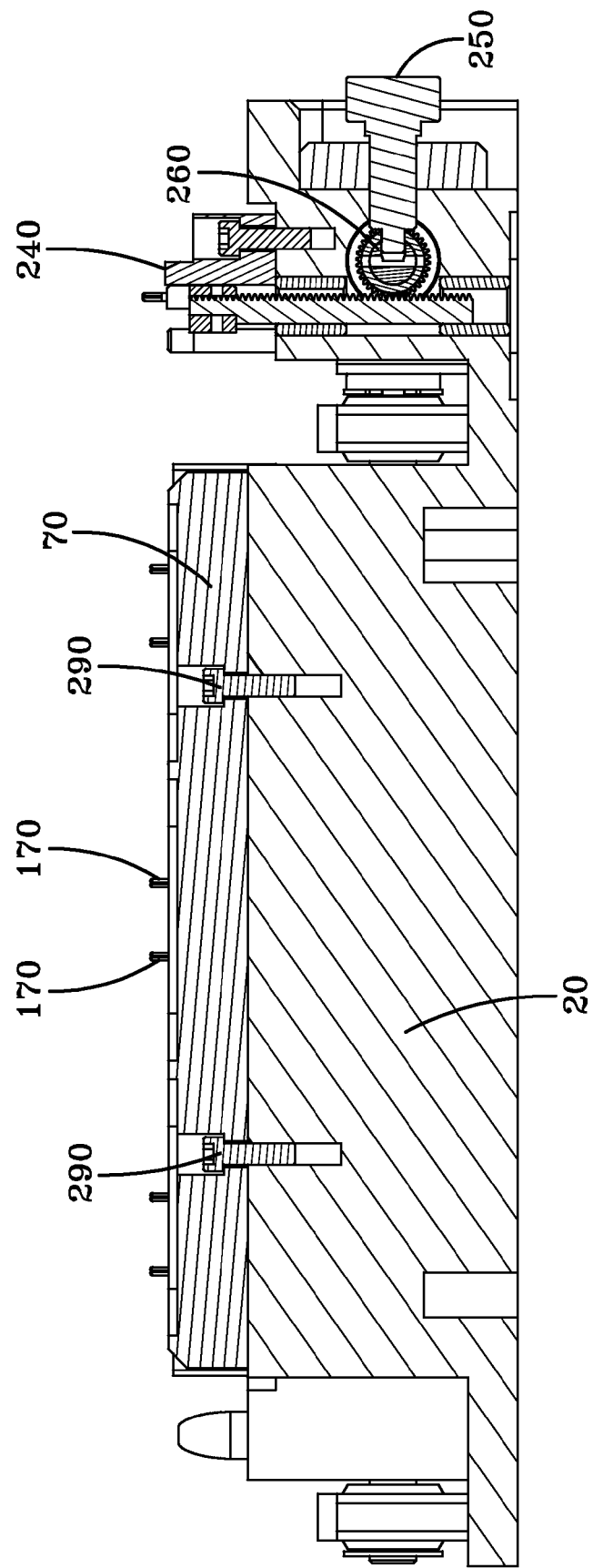
FIG. 7 shows a left side elevational view of the exemplary device of FIG. 1.

Some embodiments may include means for locking the handles 120 into the "down" position so that the pins 170 are prevented from moving. In some embodiments, such as that shown in FIGS. 1 and 7, this may be accomplished through the use of a retractable spring plunger 250 and a modified gate pinion wire 260. The spring plunger 250 may be centrally located on the front side of the gate pin block 50 and extend through the gate pin block 50 to the modified gate pinion wire 260. The modified gate pinion wire 260 has a hole 270 centrally located such that when the handles 120 are in the "down" position the retractable spring plunger 250 snaps into the hole 270 and locks the position of the modified gate pinion wire 260. This locked position is shown in FIG. 7. When it is desired to push the handles 120 into the "up" position, the retractable spring plunger 250 can be manually retracted, thereby unlocking the pinion wire 90 in the gate pinion set 100 and allowing the handles 120 to be pushed into the "up" position. In other embodiments different means for locking the pinion wire 90 in the gate pinion set 100 into either the "up", "down", or any intermediate position may be used.

In some embodiments driver supports 280 may be located on top of the pin blocks 30. In the exemplary embodiment shown in FIG. 1 the driver supports 280 have cylindrical shapes and are located between the pin holes 150 and the center platform 20. As shown in FIG. 5, the height of the driver supports 280 may be the same as the pin bases 180 when the handles 120 are in the "down" position. The driver supports 280 may provide support the weight of drivers when they are being aligned with an LCD panel. In other embodiments driver supports 280 may be located in different positions on the source blocks or may have different shapes. Other types of supports may also be used depending on the materials that the device of the exemplary embodiments is used to assemble.

The comparable heights of pin blocks 30, center platform 20, center cap 70, and fully extended pin bases 180 depends on the thickness of the materials being assembled. Because LCD displays, especially LCD membranes, may be very thin, in some embodiments of the present invention the heights of these features may be very similar. For example, in the exemplary embodiment shown in FIG. 1, where the width of the base platform 10 may be around nine inches, the difference between the height of the center cap 70 as attached to the center platform 20 and the pin bases 180 may be less than 0.02 inches. The difference between the height of a driver support 280 and a pin base 180 may be 0.01 inches or less. However, in different embodiments of the present invention where thicker materials are being assembled, there may be greater differences in height between the center cap 70, fully extended pin bases 180, and driver supports 280. In some embodiments of the present invention the pin bases 180 will be flush with the top surface of the pin blocks 30 when fully extended. However, in other embodiments, when fully extended the pin bases 180 will be higher than the top surfaces of the pin blocks 30.

The height of the pins 170 may only be as high as the thickness of the materials being assembled on the device.

However, in other embodiments the pins 170 may be higher in order to provide extra stability.

Figure 8:
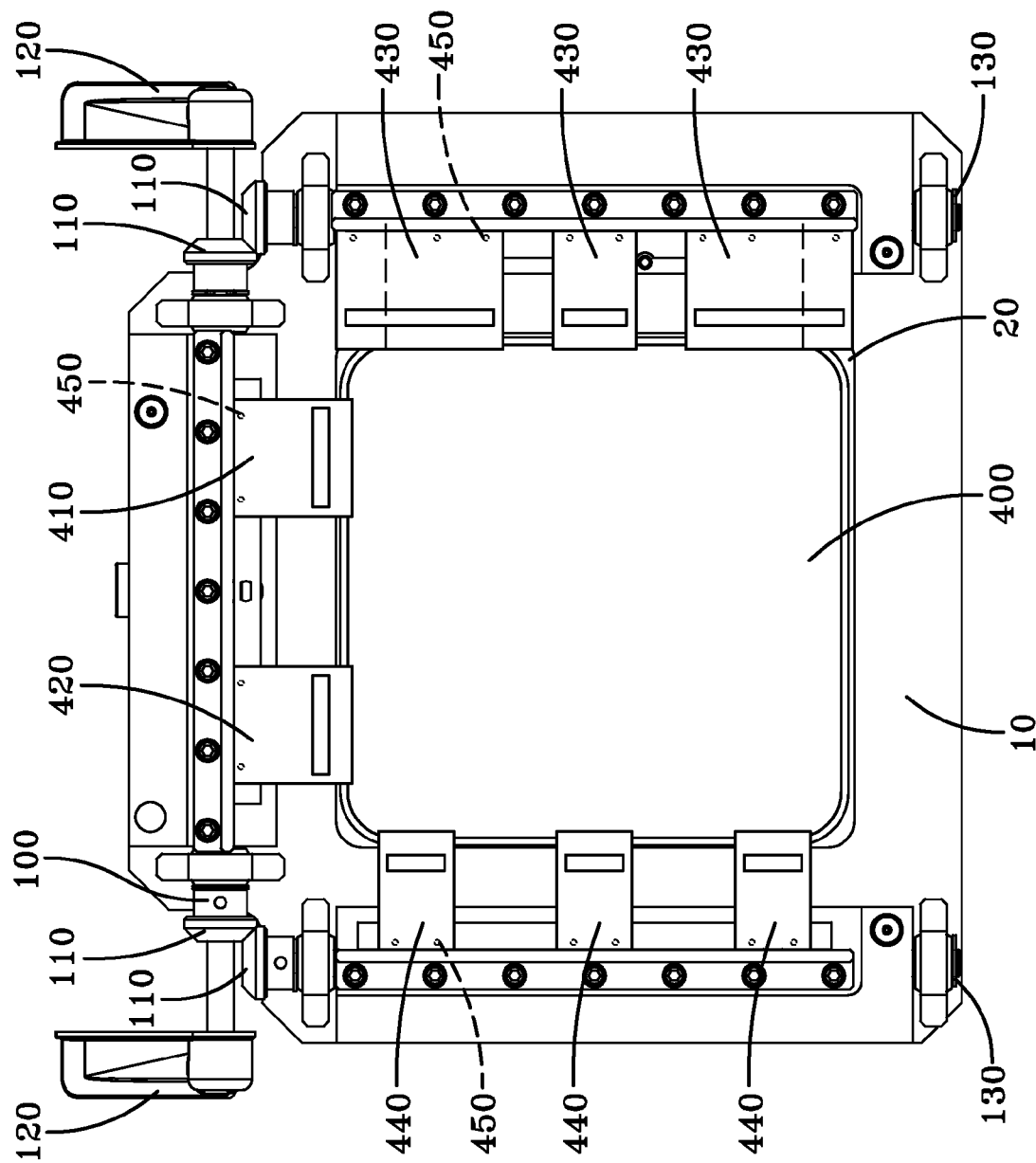
FIG. 8 shows a top plan view of the exemplary device of FIG. 1 with an LCD panel.

Exemplary embodiments may be used to secure materials in place while other materials are aligned to them, bonded to them, or while other operations are conducted. For example, some embodiments of the present invention may be used to hold LCD panels with adhered circuit elements (tabs) in place while driver circuit card assemblies (drivers) are aligned with the circuit elements and bonded. As shown in FIG. 8, an LCD panel 400 with tabs 410 attached may be centered on the center platform 20. In FIG. 8 there are gate tabs 420, source tabs 430, and heater tabs 440 attached to the LCD panel 400. At the time the LCD panel 400 is placed on the device the handles 120 may be put into the "down" position in preparation for receiving the tabs.

Each tab 410 has two or more alignment holes 450 that are sized to receive a pin 170. In this way, each gate tab 420, source tab 430, and heater tab 440 may be set upon its respective pins 170. In the exemplary embodiment of FIG. 9, the alignment holes 450 in the tabs are circular, and the pins 170 are square, which when properly proportioned may help secure the tabs in place and provide for better alignment. However, in other embodiments of the present invention circular pins 170 used in conjunction with circular alignment holes 450, or square pins 170 used in conjunction with square alignment holes 450 may be preferred. Other combinations of pin 170 shapes to alignment hole 450 shapes may be utilized as well.

Figure 9:
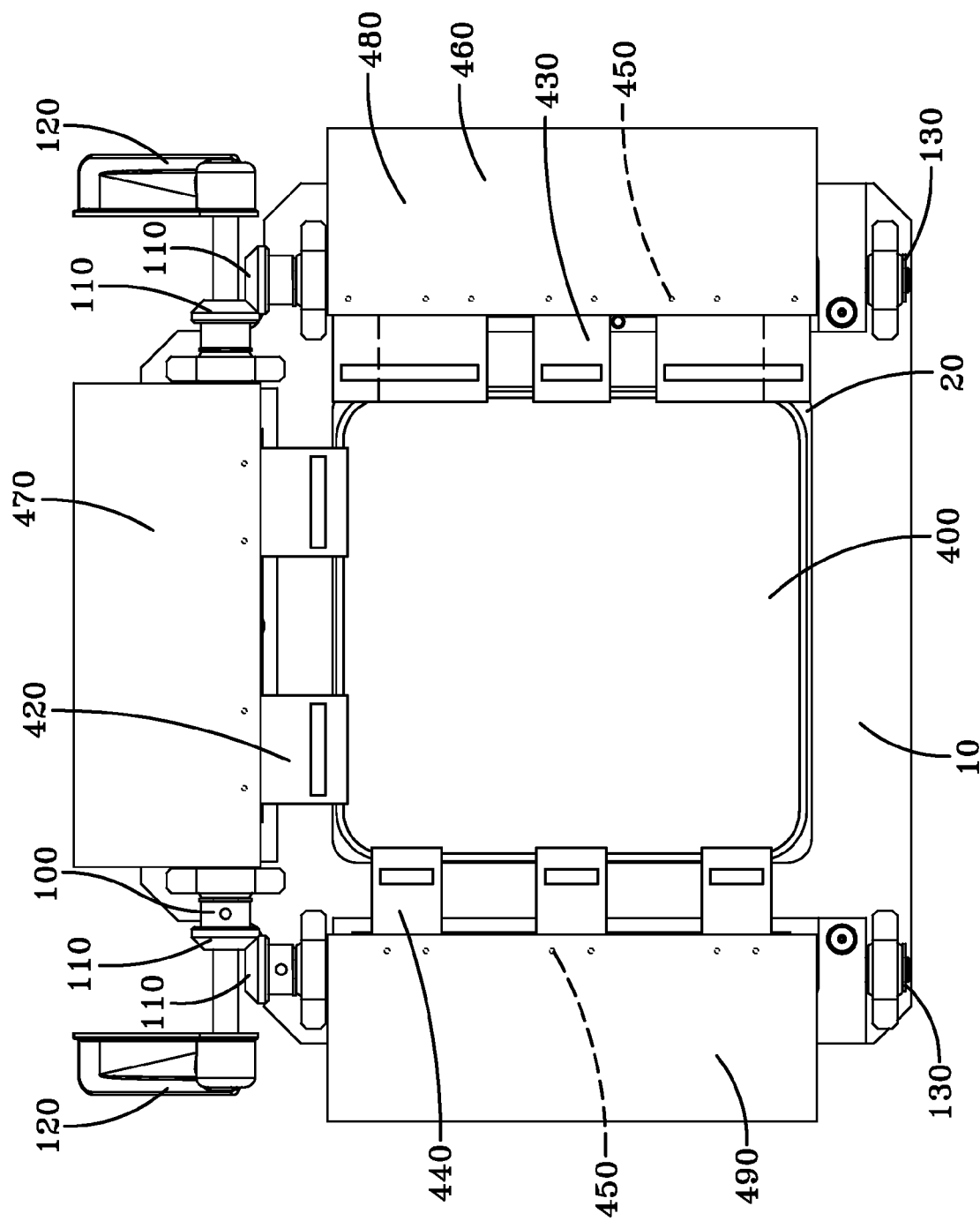
FIG. 9 shows a top plan view of the exemplary device of FIG. 1 with various drivers being positioned for bonding to the LCD tabs.

Once the LCD panel 400 with tabs 410 is positioned on the platform 20 and the pins 170 have been extended by placing the handles 120 into the "down" position, the tabs may be prepared for bonding. An electrically conductive adhesive such as anisotropic conductive film (ACF) may be placed upon the tops of the tabs. Once the tabs are prepared for bonding, one or more drivers 460 may be placed on top of one or more tabs in order to bond them together. As shown in FIG. 9, three drivers 460 may be bonded: a gate driver 470 to be aligned with the gate tabs 420, a source driver 480 to be aligned with the source tabs 430, and a heater driver 490 to be aligned with the heater tabs 440. Each driver 460 may have alignment holes of the same size as the tabs 410 in order to receive the pins 170. The positioning of the alignment holes on the drivers 460 is such that when received by the pins 170, a driver 460 will be in a desired position relative to the tabs 410. Once in this position, the drivers 460 can be bonded to the tabs 410 either manually or through the use of a tool.

Other operations may also be performed to the LCD panel 400, tabs 410, and drivers 460 while they are aligned. Once all desired operations are complete, in order to remove the LCD panel 400 now with both tabs 410 and drivers 460 attached, the handles 120 are pushed into the "up" position, which retracts the pins 170 in the manner described above. Once the pins are retracted the LCD panel 400 and all attached components can easily be lifted off the platform 400.

Figure 10:
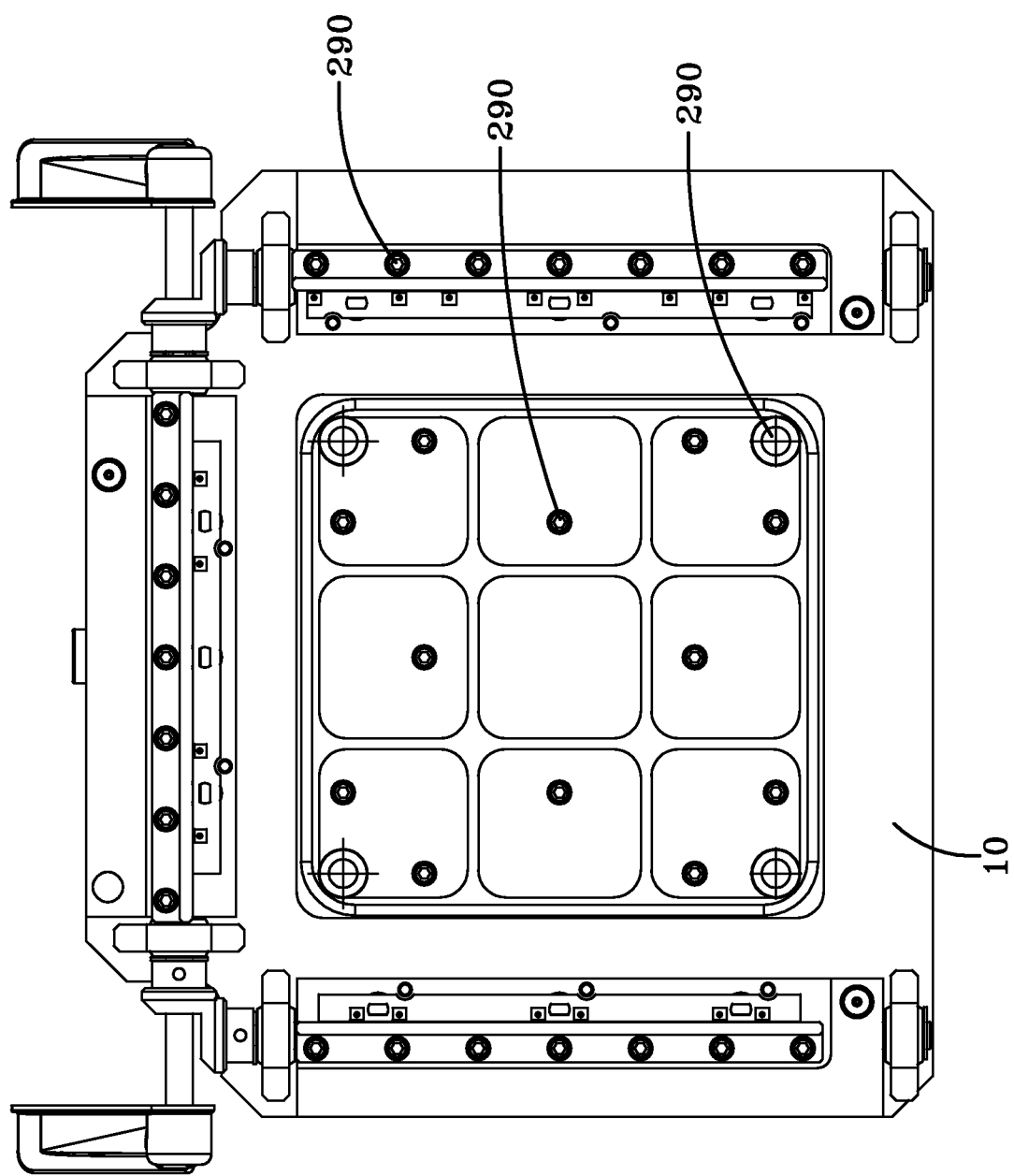
FIG. 10 shows a top plan view of the exemplary device of FIG. 1
Figure 11:
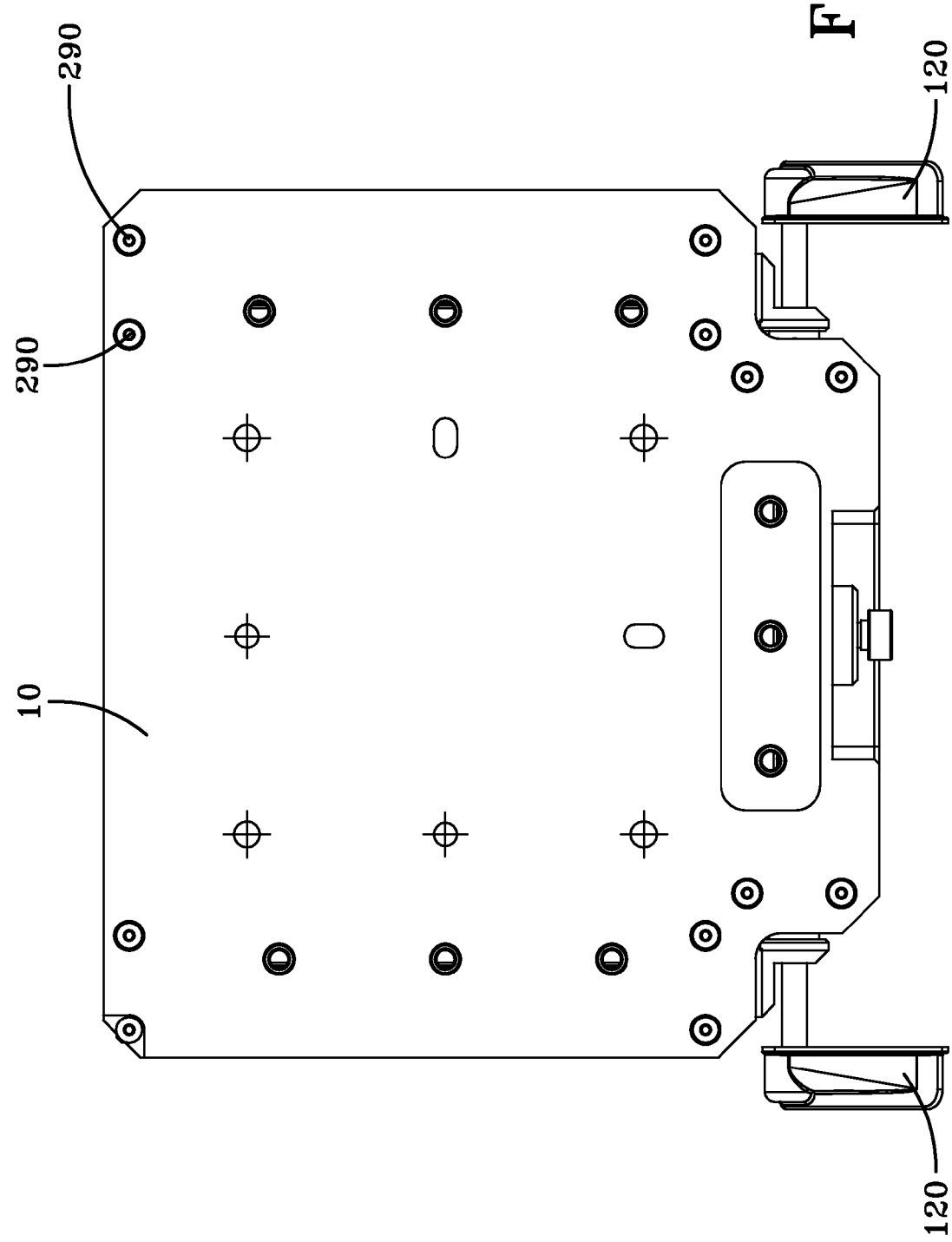
FIG. 11 shows a bottom plan view of the exemplary device of FIG. 1.
Figure 12:
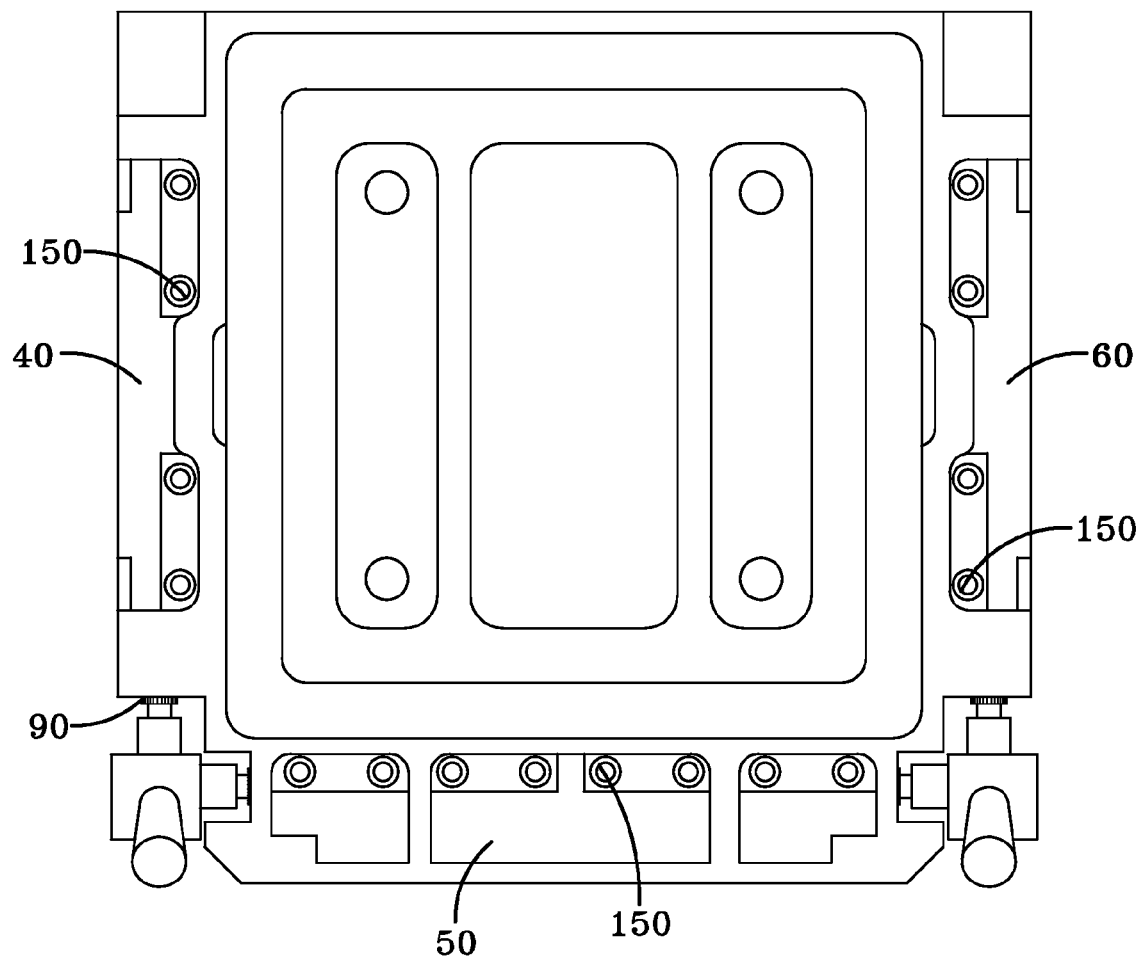
FIG. 12 shows a top plan view of a second embodiment of a device of the exemplary embodiments.

FIG. 10 shows the features of an exemplary embodiment of the present invention, and also shows that the braces 240 and center platform 20 may be adhered to the base platform 10 by screws 290. FIG. 11 shows where screws 290 may be placed on the bottom of the base platform 10.

Figure 13:
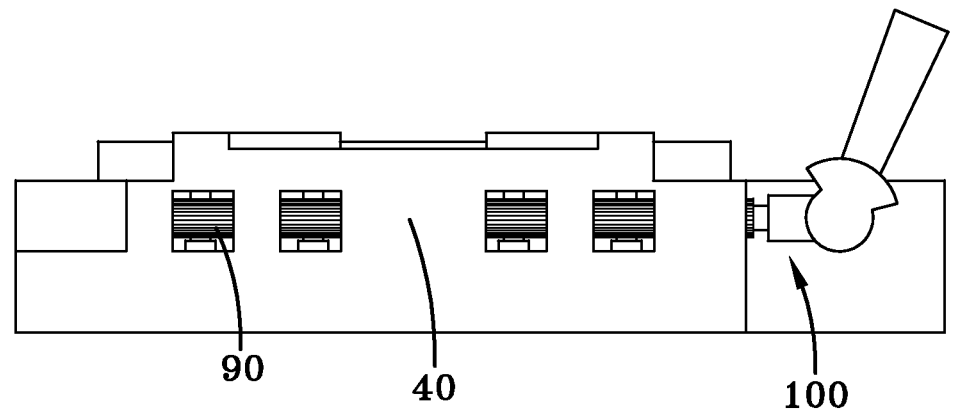
FIG. 13 shows a left side elevational view of the exemplary device of FIG. 12.
Figure 14:
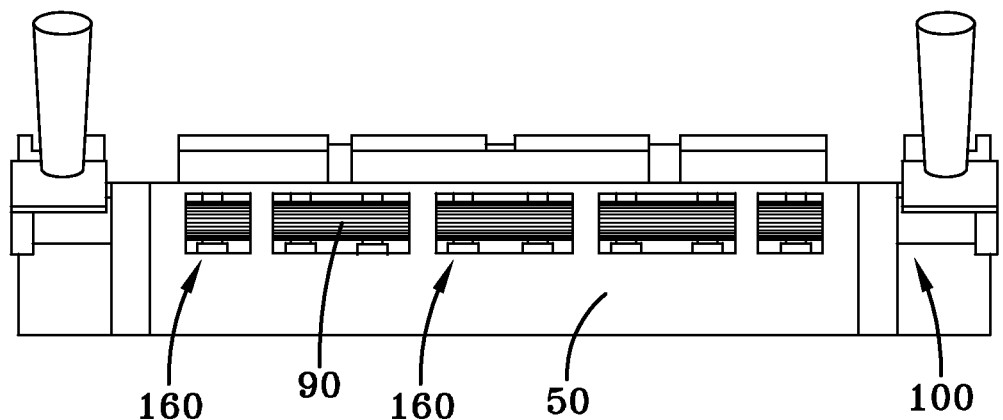
FIG. 14 shows a front elevational view of the exemplary device of FIG. 12.

FIGS. 11, 12, 13, and 14 show an exemplary embodiment made from a single piece of phenolic molding. In this embodiment the portion of the pinion wires 90 inside the pin blocks 30 can be viewed from outside the pin blocks 30. As can be seen from FIG. 12, in this embodiment there are four series of pin holes 150 along the top surface of the gate pin block 50, and each series has two pins holes 150 each. In comparison, the heater pin block 60 and source pin block 40 have two series of two pin holes 150 each. FIG. 14 shows the relative position of the pin assemblies 160 in the gate pin block 50 to the pinion wire 90 in the gate pinion set 100. As shown in FIG. 13, the handles are in an "up" position and the pins are retracted within the pin holes.

There are many additional embodiments of the present invention that vary from those described above. In some embodiments where it is desired to only align gate drivers 470 and source drivers 480 with a LCD panel 400 with tabs 410, there may be no heater pin block 60, but just a gate pin block 50 and a source pin block 40. In other embodiments of the present invention there may be four pin blocks 30, such that drivers 460 can be aligned to tabs 410 adhered to all sides of a LCD panel 400. Exemplary embodiments may be used to align any number and combination of drivers 460 with a LCD panel 400. In other embodiments of the present invention materials other than drivers 460 may be aligned with the LCD panel 400 or any type of LCD panel. In still other embodiments materials other than LCD panel 400 and drivers 460 may be aligned with one another. In some embodiments of the present invention means other than pinion sets 80 and miter gears 110 may be used to retract the pins 170.

The exemplary embodiments herein disclosed are not intended to be exhaustive or to unnecessarily limit the scope of the invention. The exemplary embodiments were chosen and described in order to explain the principles of the invention so that others skilled in the art may practice the invention. Having shown and described exemplary embodiments of the invention, those skilled in the art will realize that many variations and modifications may be made to affect the described invention. Many of those variations and modifications will provide the same result and fall within the spirit of the claimed invention. It is the intention, therefore, to limit the invention only as indicated by the scope of the claims.

What is claimed is:

1. A device for aligning a first item with a second item, comprising:
   a base;
   a platform attached to said base, said platform adapted for receiving the first item;
   at least one pin block attached to said base in a position adjacent to said platform, said pin block having a plurality of pins extending from its surface, said plurality of pins adapted for receiving the second item and holding said second item in a fixed relative position to said first item; and
   means for retracting said plurality of pins into said pin block, such that said second item is released by said plurality of pins.

2. The device of claim 1 wherein said first item is a display panel and said second item is a driver.

3. The device of claim 1 wherein:
   the device comprises three pin blocks, and
   wherein said retracting means is adapted for retracting said plurality of pins for all three pin blocks.

4. The device of claim 3, wherein said platform has a substantially rectangular perimeter, and said three at least one pin blocks are located on three different sides of said platform.

5. The device of claim 4, wherein said first item is a display panel with circuit elements attached.

6. The device of claim 5, wherein said second item is a driver.

7. A device for aligning a panel having circuit elements with a driver, comprising:
   a base;

a central platform fixedly attached to said base, said central platform adapted for receiving said panel;

a pin block attached to said base and having a fixed relative position to said central platform, said pin block having a top surface and a plurality of retractable pins extending from said top surface, said plurality of retractable pins adapted for receiving the driver when in a first position; and means for retracting said plurality of retractable pins into a second position where said plurality of retractable pins are within said pin block, wherein when said plurality of retractable pins are able to align said driver with said circuit elements on said panel when in the first position, and said driver is released by said plurality of retractable pins when said retracting means retracts said plurality of retractable pins into said second position.

8. The device of claim 7, further comprising:

a second pin block;

a third pin block; and wherein said retracting means is adapted for uniformly retracting said plurality of pins for all the pin blocks.

9. The device of claim 8, wherein said retracting means is comprised of pinion sets with pinion wires that extend through each pin block, said pinion wires have teeth, and said pinion sets are adapted to operate in unison.

10. The device of claim 9, wherein said platform is adapted for receiving an liquid crystal display panel.

11. The device of claim 7, wherein:

said central platform has a substantially rectangular shape having four sides, and said pin block is located along one side of said central platform and further comprising two additional pin blocks located on two other sides of said central platform.

12. The device of claim 11, further comprising pin bases attached to a bottom of each of said plurality of pins, said pin bases extending vertically into said pin blocks and contacting pinion wires, said pin bases having teeth sized to engage with teeth on said pinion wires, wherein through the engagement of the teeth on said pinion wires and said pin bases the rotation of said pinion wires causes said pinion bases to move vertically.

13. The device of claim 12, wherein said plurality of retractable pins on one of said pin blocks is adapted for receiving a gate driver.

14. The device of claim 12, wherein said plurality of retractable pins on one of said pin blocks is adapted for receiving a source driver.

15. The device of claim 12, wherein said plurality of retractable pins on one of said pin blocks is adapted for receiving a heater driver.

16. The device of claim 12, wherein said plurality of retractable pins on one of said pin blocks are adapted for receiving a gate driver and a source driver.

17. The device of claim 12, wherein said plurality of pins are square.

18. A method of aligning a first item with a second item, comprising the steps of:

providing a retractable pin assembly having a fixed relative location to a first surface, said retractable pin assembly having pins, said retractable pin assembly having a first position where said pins extend from said first surface of the retractable pin assembly, said retractable pin assembly having a second position where said pins are completely retracted within said retractable pin assembly;

providing a first item;

providing a second item, said second item having one or more alignment holes sized to accommodate said pins;

putting said retractable pin assembly into said first position;

placing said first item on said first surface; and placing said second item onto said retractable pin assembly such that each said alignment holes receives one said pin and said second item is aligned with said first item.

19. The method of claim 18, further comprising the steps of:

bonding said first item to said second item;

placing said retractable pin assembly into said second position; and removing the bonded first item and second item.

\* \* \* \* \*